US007127691B2

(12) United States Patent
Cruz et al.

(10) Patent No.: US 7,127,691 B2
(45) Date of Patent: Oct. 24, 2006

(54) METHOD AND APPARATUS FOR MANUFACTURING TEST GENERATION

(75) Inventors: R. Thomas Cruz, Raleigh, NC (US); Robert G. Gerowitz, Raleigh, NC (US); Claudia M. Tartevet, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 10/954,511

(22) Filed: Sep. 29, 2004

(65) Prior Publication Data

US 2006/0075315 A1    Apr. 6, 2006

(51) Int. Cl.
 *G06F 17/50* (2006.01)
(52) U.S. Cl. .............................................. 716/5; 716/6
(58) Field of Classification Search ................ 716/4–6, 716/2, 18
See application file for complete search history.

(56) References Cited

U.S. PATENT DOCUMENTS

| 5,740,353 | A | 4/1998 | Kreulen et al. ........ 395/183.18 |
| 6,080,203 | A * | 6/2000 | Njinda et al. ................... 716/4 |
| 6,347,388 | B1 | 2/2002 | Hollander ................... 714/739 |
| 6,427,224 | B1 | 7/2002 | Devins et al. .................. 716/4 |
| 6,442,747 | B1 | 8/2002 | Schzukin ...................... 716/18 |
| 6,470,482 | B1 | 10/2002 | Rostoker et al. ................ 716/6 |
| 6,530,054 | B1 | 3/2003 | Hollander ................... 714/739 |
| 6,539,522 | B1 | 3/2003 | Devins et al. .................. 716/5 |
| 6,571,373 | B1 | 5/2003 | Devins et al. .................. 716/5 |
| 6,601,229 | B1 | 7/2003 | Niederer et al. .............. 716/18 |
| 6,658,633 | B1 | 12/2003 | Devins et al. .................. 716/5 |
| 6,675,359 | B1 | 1/2004 | Gilford et al. .................. 716/1 |
| 6,910,193 | B1 * | 6/2005 | McBride ........................ 716/4 |
| 2003/0159124 | A1 * | 8/2003 | Fisher .......................... 716/18 |
| 2003/0212970 | A1 * | 11/2003 | Stong ............................ 716/5 |

FOREIGN PATENT DOCUMENTS

JP          2000-259683          9/2000

* cited by examiner

*Primary Examiner*—Thuan Do
*Assistant Examiner*—Binh Tat
(74) *Attorney, Agent, or Firm*—Sawyer Law Group LLP

(57) ABSTRACT

An improved method and process is provided for verifying a digital logic design complies with certain manufacturing test rules or guidelines. A replacement is created for any portion of a design to make it usable by the manufacturing test tool set, without requiring the contents of that portion of the design to be implemented. The inputs and outputs of a portion of the design are examined for violations of the manufacturing test rules or guidelines. If there are no violations, the contents of this portion of the design are replaced with some basic contents which satisfy the manufacturing structure rules. The interconnections between logic blocks can then be tested using test generation tools to ensure the design does not violate manufacturing test rules or guidelines The compliance verification can thus be done much earlier in the design process than typically occurs.

36 Claims, 7 Drawing Sheets

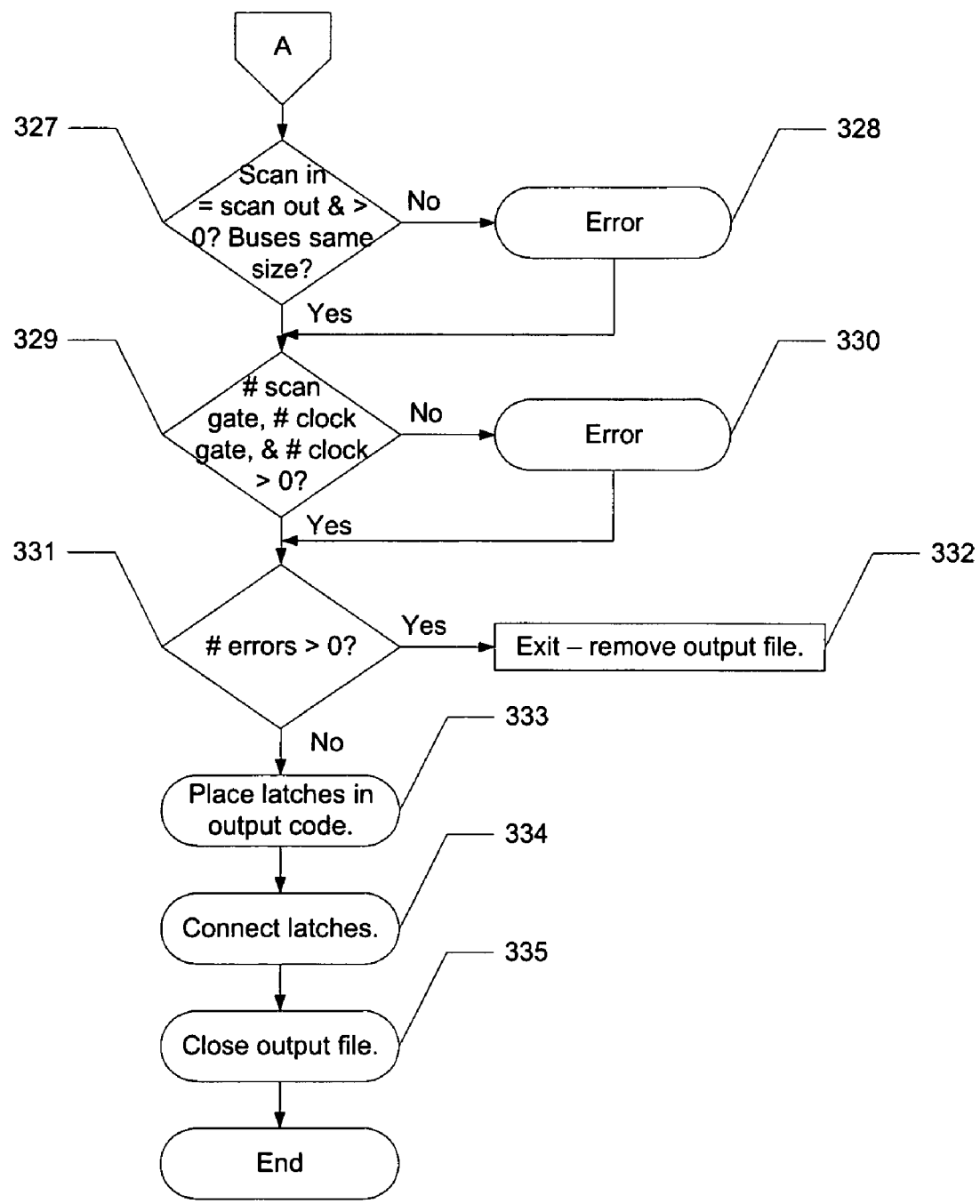
FIG. 3 (con't)

Clk1 and Clk2 are functional clocks. The scan clocks are present and not shown.

METHOD AND APPARATUS FOR MANUFACTURING TEST GENERATION

FIELD OF THE INVENTION

The present invention relates to the process of verifying a digital logic design complies with certain manufacturing test rules or guidelines, to ensure adequate manufacturing test data can be generated.

BACKGROUND OF THE INVENTION

During the design of any digital component, tests are required to determine the manufacturability of the component. FIG. 1 illustrates a conventional flow diagram of a typical digital design. Rough sizing and capabilities are created in the Design Concept stage, as represented by blocks 1, 2, and 3, along with some high level data or control flow paths, and some high level interconnections between major functions. During the high level design (HLD) phase, represented by blocks 4, 5, and 6, the design is broken down into its smallest pieces. These design pieces are coded in a design language, for example, Very high speed integrated circuit Hardware Description Language (VHDL). Possible design languages are well known in the art. At this point, the design represents a close approximation of the final design, where the coded pieces do not necessarily achieve the final timing, area, or power budgets, nor do they implement all the necessary functions. During the low level design (LLD) phase, represented by blocks 7, 8, and 9, all levels of logic are implemented. Through successive iterations, the design eventually meets all budgets and performs all functions.

The verification of manufacturability, i.e., that the complete design complies with test structure rules, cannot begin until all low level blocks have been coded, represented in box 6. The impact of block interconnections on manufacturability also cannot be verified until box 6, or perhaps as late as chip completion, represented by box 9. This can cause schedule slippage and/or lower quality manufacturing tests to be developed if problems are found late in the design process.

Accordingly, there exists a need for an improved method and process to verify a digital logic design complies with certain manufacturing test rules or guidelines. The improved method and process should allow verification of manufacturability before all low level logics are implemented. The present invention addresses such a need.

SUMMARY OF THE INVENTION

An improved method and process to verify a digital logic design complies with certain manufacturing test rules or guidelines creates a new representation of any portion of a digital logic design to make it usable by a manufacturing test tool set, without requiring all of the lower level logic to be implemented. In creating the new representation, the inputs and outputs of a portion of the design are examined for violations of the manufacturing test rules or guidelines. The process discovers many semantic, or lint, types of errors, such as an unbalanced number of scan input and scan output pins and problems with clocking or other control signals as it inspects the pins of the piece of the design being replaced. This allows the debugging of errors in the very early stages of the design process, and is performed without simulation or complex model creation, thereby greatly speeding up the process of diagnosis and repair. Once the errors have been corrected, the contents of this portion of the design are replaced with some basic contents which satisfy the manufacturing test structure rules. The interconnections between logic blocks can then be tested using commercial or proprietary test generation tools to ensure the design does not violate manufacturing test rules or guidelines. The verification that a digital logic design complies with certain manufacturing test rules or guidelines can thus be done much earlier in the design process than typically occurs.

DETAILED DESCRIPTION

The present invention provides an improved method and process for verifying a digital logic design complies with certain manufacturing test rules or guidelines. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

To more particularly describe the features of the present invention, please refer to FIGS. 2 through 6 in conjunction with the discussion below.

Figure 2:
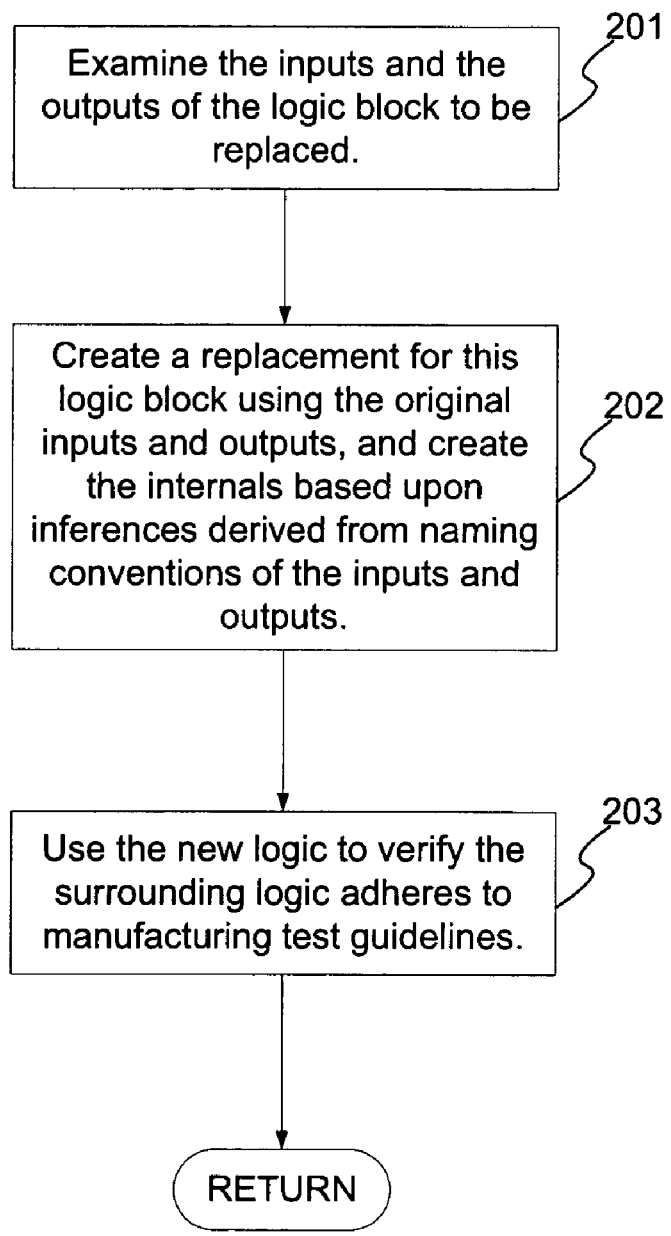
FIG. 2 is a flowchart illustrating a preferred embodiment of a method for verifying a design complies with certain manufacturing test rules or guidelines in accordance with the present invention.

The method and process in accordance with the present invention creates a new representation of any portion of a design to make it usable by a manufacturing test tool set, without requiring all pieces of the design to be implemented. FIG. 2 is a flowchart illustrating a preferred embodiment of a method for creating a new representation of a portion of the design in accordance with the present invention. In the preferred embodiment, the method is implemented as a computer software program. Naming conventions are typically used to indicate functionality for pins such as scan inputs, scan outputs, and clocks. For example, the convention "*scanin", which is read as "anything followed by the string 'scanin'" can denote scan in pins, "*scanout" can be used to denote scan out pins, and so forth. These conventions allow designers to automate the running of many of the digital design tools, such as the manufacturing test generation applications, specifically on any portion of a design.

However, in order for these applications to function, some basic logic must exist within these design portions.

Figure 1:
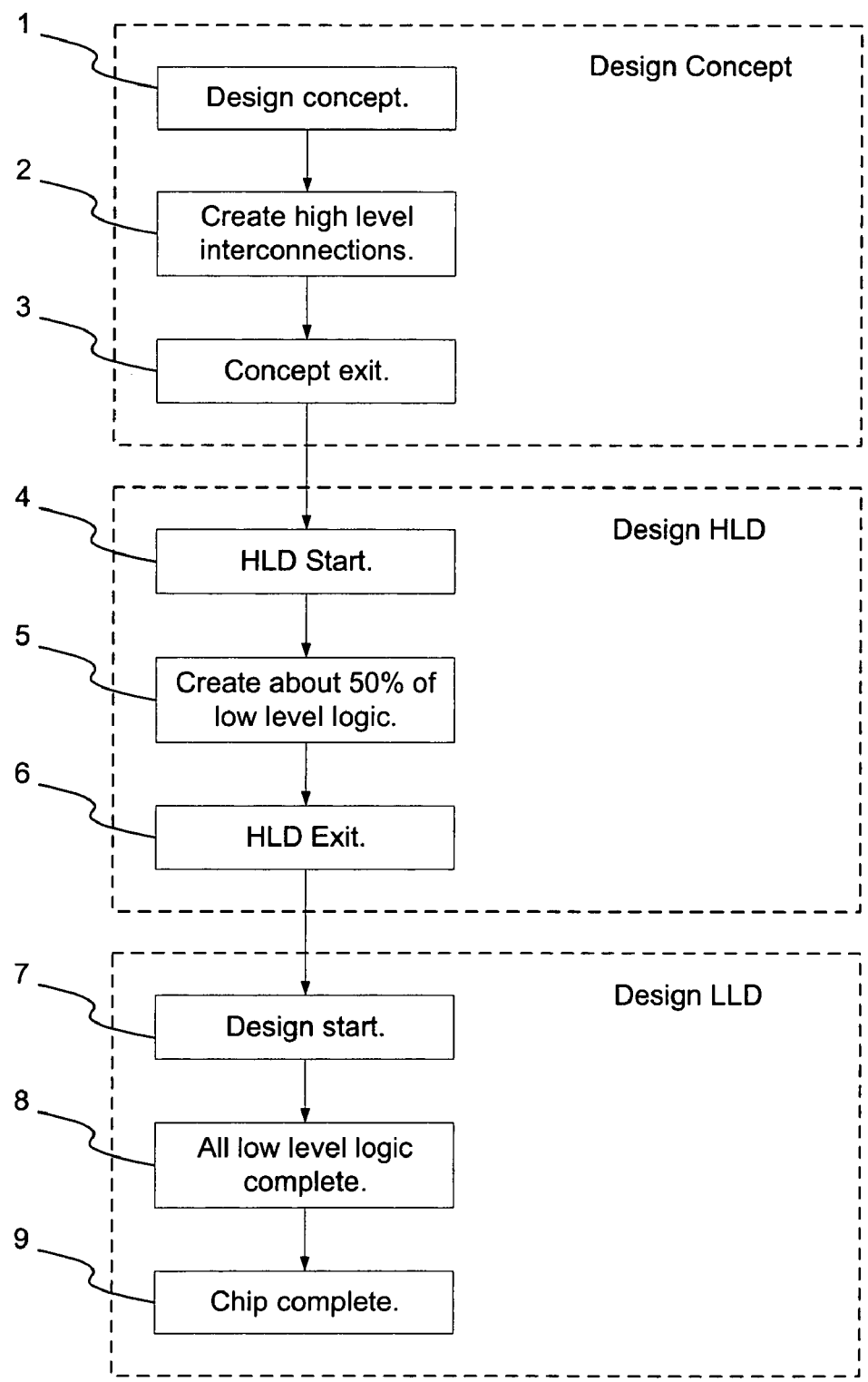
FIG. 1 illustrates a conventional flow diagram in a typical digital design development process.

To create this replacement logic according to the present invention, first, the input and output pins of at least one logic block of the digital logic design are examined, via step 201, where a low level logic for the logic block may not have been completed. In other words, the input and output pins of some portion of a digital logic design are categorized based on various naming conventions before the Design LLD stage (see FIG. 1). While examining the input and output pins of the block, error messages are generated for many lint types of errors, such as unbalanced number of scan input and scan output pins and problems with clocking or other control signals. Next, a new output file is created for the logic block, via step 202, comprised of the original pin definitions. This is combined with a new content definition, based upon inferences derived from information obtained from inspecting the naming conventions used on the input and output pins. The new content definition typically includes items such as a latch for each scan input and output pair, and a clock splitter for each system clock to drive these new latches. In essence, the present invention creates a replacement logic block which contains enough logic to allow the designer to verify a digital logic design complies with certain manufacturing test rules or guidelines.

Figure 4:
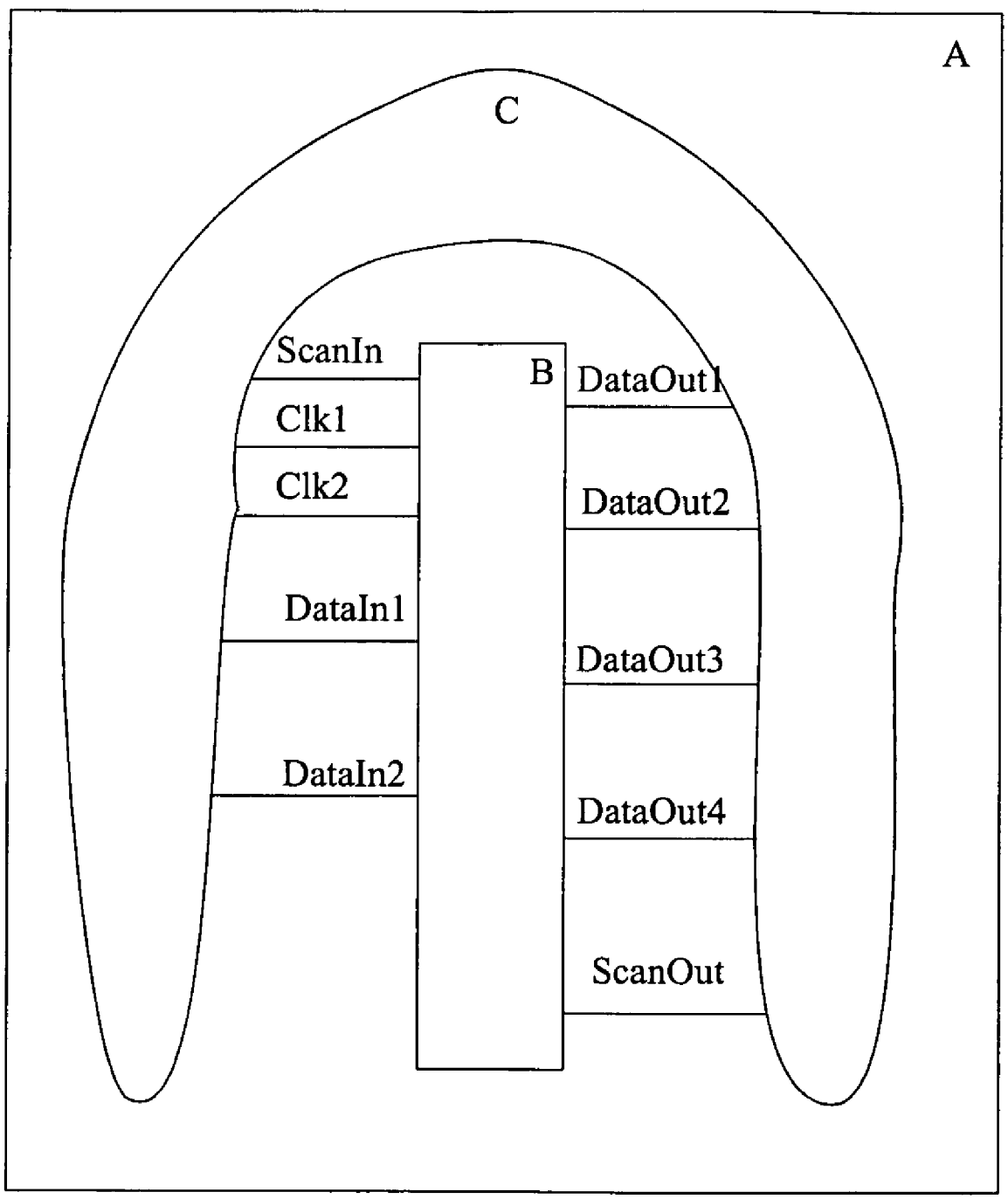
FIG. 4 depicts a block of logic which is surrounded by other logic, and having several input and output pins, but having no contents.
Figure 5:
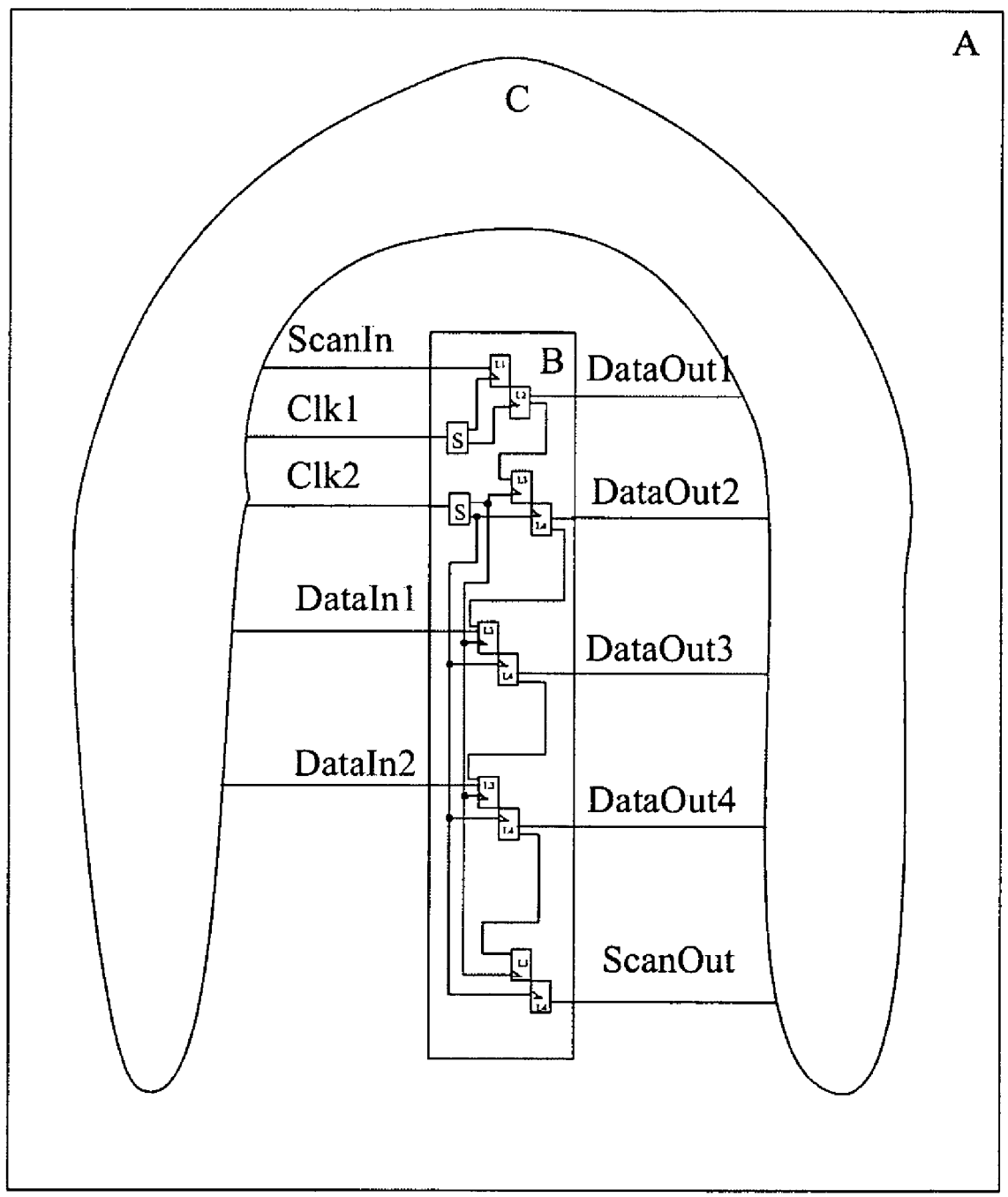
FIG. 5 depicts the block of logic from FIG. 4 after the improved method has been run on it, showing how some basic logic has been added as contents for the block.
Figure 6:
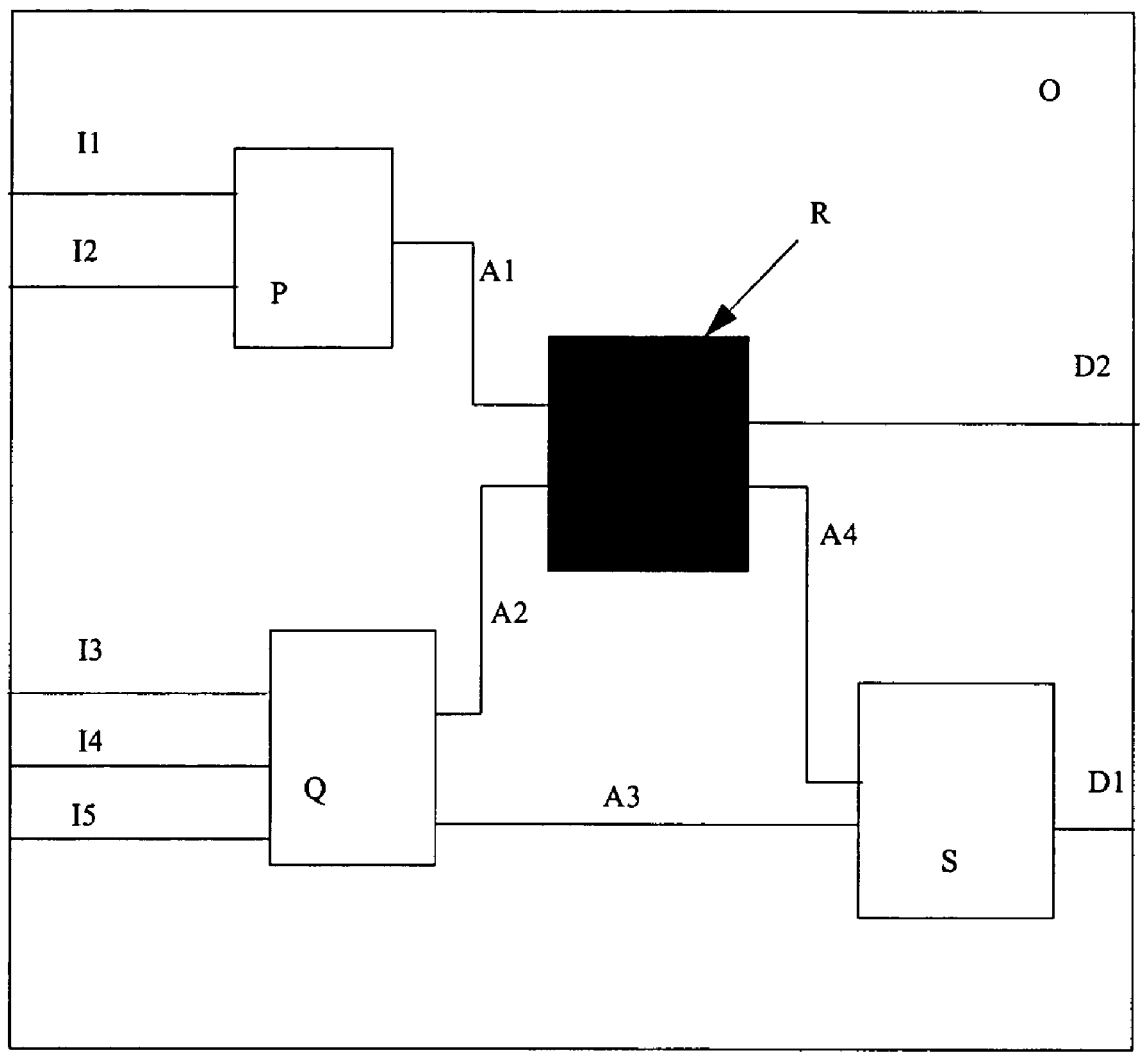
FIG. 6 depicts how this might appear as a part of a larger design. It shows a solid black box, which depicts some level of logic which does not have any contents being fed and feeding other logical elements.

This is shown pictorially in FIGS. 4 through 6. FIG. 4 shows some block of logic, labeled B, which has input pins ScanIn, Clk1, Clk2, DataIn1 and DataIn2, and has the output pins DataOut1, DataOut2, DataOut3, DataOut4, and ScanOut. Block B is contained within the larger block, labeled A, which may be included by other logic. Block B is surrounded by other logic within block A, which is labeled as C. Since the contents of B does not exist, signals cannot be propagated through block B, nor can it be determined if any of the signals on block B have been connected properly. FIG. 5 shows how block B would appear after this embodiment of the present invention has been run. The pins ScanIn and ScanOut indicate block B contains a single scan chain, based upon the naming conventions of these pins. However, since two clocks have been specified, via the input pins of CLK1 and CLK2 on block B, two clock splitters are created within block B, each driving a unique scanable latch inside block B. Since the inputs DataIn1 and DataIn2, and the outputs Dataout1, DataOut2, DataOut3, and DataOut4 do not match any naming conventions, and therefore do not have any special manufacturing test functions, latches are inserted into block B to receive these input signals and to drive these outputs. In this manner, the designer can verify the interconnection of the signals feeding block B, and the interconnection of signals fed by block B. For clarity, the scan clock pins and their interconnects have not been depicted in these figures, but they are present.

FIG. 6 illustrates the block O with interconnections (A1, A2, A3, A4) between the blocks P and R, Q and R, R and S, and Q and S. The interconnections A1, A2, A4, and D2 are untested if the contents of R does not exist. This may also lead to other upstream and downstream interconnections being untested. For example, the logic in block S fed by A3 may be gated by the A4 signals from block R. Since the A4 signals are uncontrolled, it may not be possible to adequately test block S. Thus, in accordance with the present invention, scanable logic is inserted inside block R to receive the signals A1 and A2, and drive the signals A4 and D2. In the example above, scanable logic for driving signal A4 inserted in block R would allow the test applications to drive any signal necessary on A4, resulting in block S being fully testable. Also, scanable logic receiving the signals A1 and A2 in block R would allow the test applications to verify the interconnections between block P and R and block Q and R. The same can be done for upstream and downstream logic, such as the logic fed by the outputs of block O.

In the preferred embodiment, the new output file is synthesized into a technology dependant netlist, which is used by the test generation applications. The test generation tool verifies the logic surrounding the replacement design, along with the replacement design, adheres to manufacturing test guidelines, via step 203. The detection of manufacturing structure violations can thus be done much earlier in the design process than typically expected. With the present invention, this can be done as early as during the Design Concept stage, when only the high level interconnections have been created (represented by block 2 of FIG. 1) but before the low level logic has been completed (represented by block 8 of FIG. 1).

Figure 3:
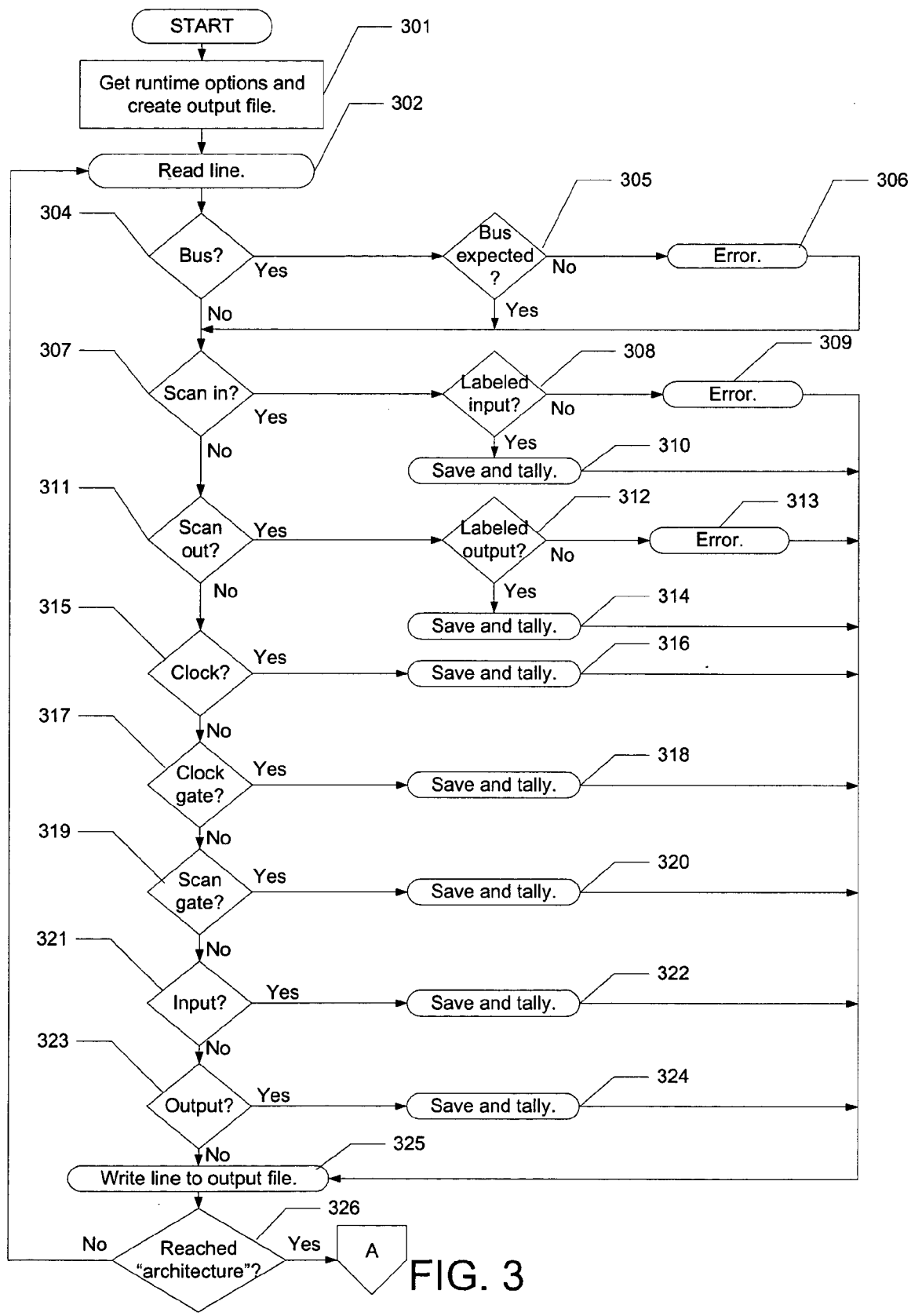
FIG. 3 is a flowchart illustrating in more detail the method for verifying a design complies with certain manufacturing test rules or guidelines in accordance with the present invention.

FIG. 3 is a more detailed flowchart illustrating the embodiment of a method for verifying a design complies with certain manufacturing test rules or guidelines in accordance with the present invention. First, the runtime options are obtained and an output file is created, via step 301. The runtime options include the name of the file containing the design description to be converted to a dummy block, the location of the file, and the location of the output file. Next, a line in the design description file is read, via step 302, and inspected to see if it contains input or output pin declarations. The names of the pins allow certain assumptions to be made about the logic block, such as what types of latches the new output file should contain. When it finds such an input or output pin declaration, it undergoes a series of inspections detailed in steps 304 through 323, as described in the paragraphs below. Each line of the file is copied from the original file to the new file until the architecture of the design is encountered, where the architecture is defined as the logic gates necessary to implement the function of the design. The entire file is read and inspected for problems, however, the output file is removed at the end of the run if any error messages are issued by this process. This allows the debugging of as many errors as possible in the very early stages of the design process, and is performed without simulation or model creation, thereby greatly speeding up the process of diagnosis and repair.

The input and output pins are examined for buses, via step 304. If found, determine if they are supposed to be buses, via step 305. For example, a clock should not be a bus, but a scan input may be a bus. If there is an error, a message is issued, via step 306, and an error counter is incremented.

If the naming conventions indicate a scan input, via step 307, verify it is labeled as an input pin, via step 308. If not, an error message is issued, via step 309, and an error counter is incremented. Otherwise, the pin is saved in a scan in list and the total number of scan inputs is incremented (tallied), via step 310, and the process proceeds to step 325.

If the naming conventions indicate a scan output, via step 311, verify it is labeled as an output pin, via step 312. If not, an error message is issued, in step 313, and the error counter is incremented. Otherwise, the pin is saved in a scan out list and the total number of scan outputs is incremented (tallied), via step 314, and the process proceeds to step 325.

If the naming conventions indicate the pin is a clock, via step 315, the pin is saved in a clock list and the total number of clocks is incremented, via step 316, and the process proceeds to step 325.

If the naming conventions indicate the pin is a clock gate, via step 317, the pin is saved in a clock gate list and the total number of clock gates is incremented (tallied), via step 318, and the process proceeds to step 325.

If the naming conventions indicate the pin is a scan gate, via step 319, the pin is saved in a scan gate list and the total number of scan gates is incremented (tallied), via step 320, and the process proceeds to step 325.

If the pin has not been identified as any of the preceding types and it is determined to be an input pin, via step 321, the pin is saved in a list and the number of 'other' inputs is incremented (tallied), via step 322, and the process proceeds to step 325.

If the pin has not been identified as any of the preceding types and it is determined to be an output pin, via step 323, the pin is saved in a list of output pins and the number of 'other' outputs is incremented (tallied), via step 324, and the process proceeds to step 325.

The current line is then written to the output file, via step 325. If it has been determined the architecture of the design has not been read, via step 326, the process returns to step 302. Steps 302 through 325 are repeated for the next line. If the architecture is found, the process continues with step 327.

Steps 327 through 335, described below, are another level of inspection of data collected regarding the input and output pins.

Verify the total number of scan inputs matches the total number of scan outputs, via step 327. Next, if the scan inputs or outputs are buses, verify they are both the same size buses. Also verify the number of scan inputs and outputs is greater than zero. If there is an error, an error message is generated, via step 328, and the error counter is incremented.

Verify there is at least one scan gate, one clock gate, and one clock, via step 329. If there is an error, an error message is generated, via step 330, and the error count is incremented.

If there are any errors, the process is exited, via step 331, and the output file is removed, via step 332. Otherwise, the process continues with step 333.

In step 333, the latches are selected based on the names of the input and output pins, and placed in the output file. After the latches have been selected, they are appropriately inserted into the design, and the scan chains are connected, via step 334. The scan gates, clocks, clock splitters, and other logic are also added. Finally, the output file is completed and closed, via step 335. The output file is put into the directory indicated by the runtime options, obtained at step 301.

An improved method and process of verifying a digital logic design complies with certain manufacturing test rules or guidelines to ensure adequate manufacturing test data can be generated has been disclosed. The improved method and process creates a replacement for any portion of a design to make it usable by the manufacturing test tool set, without requiring the contents of that portion of the design to be implemented. In creating the new representation, the input and output pins of a portion of the design are examined for violations of the manufacturing test rules or guidelines. If there are no violations, the contents of this portion of the design are replaced with some basic contents which satisfy the manufacturing structure rules. The interconnections between logic blocks can then be tested using commercial or proprietary test generation tools to ensure the design does not violate manufacturing test rules or guidelines The verification that a digital logic design complies with certain manufacturing test rules or guidelines can thus be done much earlier in the design process than typically occurs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer-implemented method for manufacturing test generation, comprising:
   determining inputs and outputs of a first logic block of a digital logic design, the first logic block not yet having logic designed that internally connects the inputs and the outputs within the first logic block;
   creating an output file for the first logic block including inserting scanable logic within the at least one logic block, the scanable logic internally connecting the inputs and the outputs to permit the first logic block to be testable, wherein the scanable logic inserted into the first logic block comprise a latch for each non-clock input pin and each non-clock output pin; and scanable latches for signals of the first logic block being fed or feeding other logic block of the digital logic design; and
   testing a second logic block coupled to the inputs or the outputs of the first logic block utilizing the output file to determine manufacturing test structure violations associated with the second logic block or the first logic block.

2. The method of claim 1, wherein the scanable logic inserted into the first logic block further comprises a clock splitter for each input system clock pin.

3. The method of claim 1, wherein a portion of the testing is performed without simulation or model building of the digital logic design.

4. The method of claim 1, wherein determining inputs and outputs of the first logic block comprises:
   obtaining runtime options including a name of a file containing a design description of the first logic block.

5. The method of claim 4, wherein creating an output file comprises:
   reading a line from the file containing the design description of the first logic block; and
   inspecting the line for pins.

6. The method of claim 5, wherein inspecting the line for pins comprises:
   determining if any of the pins is a bus;
   for each pin that is a bus, determining if a bus is expected for the pin based on predetermined logic design criteria; and
   indicating an error and incrementing an error counter, if a bus is not expected based on the predetermined logic design criteria.

7. The method of claim 5, wherein inspecting the line for pins comprises:
   determining if any of the pins is a scan input pin;
   for each pin that is a scan input, determining if the pin is labeled as an input pin;
   indicating an error and incrementing an error counter, if the pin is not labeled as an input pin; and
   incrementing a total number of scan inputs, if the pin is labeled as an input pin.

8. The method of claim 5, wherein inspecting the line for pins comprises:
   determining if any of the pins is a scan output pin;

for each pin that is a scan output, determining if the pin is labeled as an output pin;
indicating an error and incrementing an error counter, if the pin is not labeled as an output pin; and
incrementing a total number of scan outputs, if the pin is labeled as an output pin.

9. The method of claim 5, wherein inspecting the line for pins comprises:
determining if any of the pins is a clock; and
for each pin that is a clock, incrementing a total number of clocks.

10. The method of claim 5, wherein inspecting the line for pins comprises:
determining if any of the pins is a clock gate; and
for each pin that is a clock gate, incrementing a total number of clock gates.

11. The method of claim 5, wherein inspecting the line for pins comprises:
determining if any of the pins is a scan gate; and
for each pin that is a scan gate, incrementing a total number of scan gates.

12. The method of claim 5, wherein inspecting the line for pins comprises:
for each pin that has not yet been determined to be of any type, determining if the pin is an input pin; and
for each pin that is an input pin, incrementing a total number of input pins.

13. The method of claim 5, wherein inspecting the line for pins comprises:
for each pin that has not yet been determined to be of any type, determining if the pin is an output pin; and
for each pin that is an output pin, incrementing a total number of output pins.

14. The method of claim 5, wherein creating an output file further comprises:
writing the read line to the output file;
determining if the last line of the file has been reached; and
reading a next line of the file and inspecting the next line for pins, if the last line of the file has not been reached.

15. The method of claim 14, wherein if the last line of the file has been reached, then creating an output file further comprises:
further inspecting pins of the first logic block being replaced.

16. The method of claim 15, wherein inspecting pins of the logic block being replaced comprises:
verifying that a total number of scan inputs matches a total number of scan outputs;
verifying scan input buses are the same size as scan output buses;
verifying that the total number of scan inputs and the total number of scan outputs are greater than zero; and
indicating an error and incrementing an error counter if the total number of scan inputs does not match the total number of scan outputs, the scan input buses are not the same size as the scan output buses, or the total number of scan inputs and the total number of scan outputs are not greater than zero.

17. The method of claim 15, wherein inspecting pins of the logic block being replaced comprises:
verifying that there is at least one scan gate, at least one clock gate, and at least one clock; and
indicating an error and incrementing an error counter if there is not at least one scan gate, at least one clock gate, or at least one clock.

18. The method of claim 15, wherein creating an output file further comprises:
removing the output file if at least one error is found in the pins;
if no errors are found in the pins, then:
selecting latches based on the pins and placing the latches in the output file, including inserting the latches into the first logic block and connecting scan chains within the first logic block and adding scan gates and clocks to the first logic block.

19. A computer readable medium with program instructions tangibly stored thereon for manufacturing test generation, the computer readable medium comprising program instructions for:
determining inputs and outputs of a first logic block of a digital logic design, the first logic block not yet having logic designed that internally connects the inputs and the outputs within the first logic block;
creating an output file for the first logic block including inserting scanable logic within the at least one logic block, the scanable logic internally connecting the inputs and the outputs to permit the first logic block to be testable, wherein the scanable logic inserted into the first logic block comprise a latch for each non-clock input pin and each non-clock output pin; and scanable latches for signals of the first logic block being fed or feeding other logic block of the digital logic design; and
testing a second logic block coupled to the inputs or the outputs of the first logic block utilizing the output file to determine manufacturing test structure violations associated with the second logic block or the first logic block.

20. The medium of claim 19, wherein the scanable logic inserted into the first logic block further comprises a clock splitter for each input system clock pin.

21. The medium of claim 19, wherein a portion of the testing is performed without simulation or model building of the digital logic design.

22. The medium of claim 19 wherein the instructions for determining inputs and outputs of the first logic block comprises instructions for:
obtaining runtime options including a name of a file containing a design description of the first logic block.

23. The medium of claim 22, wherein the instructions for creating an output file comprises instructions for:
reading a line from the file containing the design description of the first logic block; and
inspecting the line for pins.

24. The medium of claim 23, wherein the instructions for inspecting the line for pins comprises instructions for:
determining if any of the pins is a bus;
for each pin that is a bus, determining if a bus is expected for the pin based on predetermined logic design criteria; and
indicating an error and incrementing an error counter, if a bus is not expected based on the predetermined logic design criteria.

25. The medium of claim 23, wherein the instructions for inspecting the line for pins comprises instructions for:
determining if any of the pins is a scan input pin;
for each pin that is a scan input, determining if the pin is labeled as an input pin;
indicating an error and incrementing an error counter, if the pin is not labeled as an input pin; and
incrementing a total number of scan inputs, if the pin is labeled as an input pin.

26. The medium of claim 23, wherein the instructions for inspecting the line for pins comprises instructions for:
 determining if any of the pins is a scan output pin;
 for each pin that is a scan output, determining if the pin is labeled as an output pin;
 indicating an error and incrementing an error counter, if the pin is not labeled as an output pin; and
 incrementing a total number of scan outputs, if the pin is labeled as an output pin.

27. The medium of claim 23, wherein the instructions for inspecting the line for pins comprises instructions for:
 determining if any of the pins is a clock; and
 for each pin that is a clock, incrementing a total number of clocks.

28. The medium of claim 23, wherein the instructions for inspecting the line for pins comprises instructions for:
 determining if any of the pins is a clock gate; and
 for each pin that is a clock gate, incrementing a total number of clock gates.

29. The medium of claim 23, wherein the instructions for inspecting the line for pins comprises instructions for:
 determining if any of the pins is a scan gate; and
 for each pin that is a scan gate, incrementing a total number of scan gates.

30. The medium of claim 23, wherein the instructions for inspecting the line for pins comprises instructions for:
 for each pin that has not yet been determined to be of any type, determining if the pin is an input pin; and
 for each pin that is an input pin, incrementing a total number of input pins.

31. The medium of claim 23, wherein the instructions for inspecting the line for pins comprises instructions for:
 for each pin that has not yet been determined to be of any type, determining if the pin is an output pin; and
 for each pin that is an output pin, incrementing a total number of output pins.

32. The medium of claim 23, wherein the instructions for creating an output file further comprises instructions for:
 writing the read line to the output file;
 determining if the last line of the file has been reached; and
 reading a next line of the file and inspecting the next line for pins, if the last line of the file has not been reached.

33. The medium of claim 32, wherein if the last line of the file has been reached, then the instructions for creating an output file further comprises instructions for:
 further inspecting pins of the first logic block being replaced.

34. The medium of claim 33, wherein the instructions for inspecting pins of the logic block being replaced comprises instructions for:
 verifying that a total number of scan inputs matches a total number of scan outputs;
 verifying scan input buses are the same size as scan output buses;
 verifying that the total number of scan inputs and the total number of scan outputs are greater than zero; and
 indicating an error and incrementing an error counter if the total number of scan inputs does not match the total number of scan outputs, the scan input buses are not the same size as the scan output buses, or the total number of scan inputs and the total number of scan outputs are not greater than zero.

35. The medium of claim 33, wherein the instructions for inspecting pins of the logic block being replaced comprises instructions for:
 verifying that there is at least one scan gate, at least one clock gate, and at least one clock; and
 indicating an error and incrementing an error counter if there is not at least one scan gate, at least one clock gate, or at least one clock.

36. The medium of claim 33, wherein the instructions for creating an output file further comprises instructions for:
 removing the output file if at least one error is found in the pins;
 if no errors are found in the pins, then:
  selecting latches based on the pins and placing the latches in the output file, including inserting the latches into the first logic block and connecting scan chains within the first logic block and adding scan gates and clocks to the first logic block.

* * * * *